(12) United States Patent
Hashimoto et al.

(10) Patent No.: US 9,741,594 B2
(45) Date of Patent: Aug. 22, 2017

(54) SUBSTRATE PROCESSING APPARATUS AND SUBSTRATE PROCESSING METHOD FOR PERFORMING HEAT TREATMENT ON SUBSTRATE

(71) Applicants: Katsumi Hashimoto, Kyoto (JP); Manabu Nakanishi, Kyoto (JP); Takashi Matsushita, Kyoto (JP)

(72) Inventors: Katsumi Hashimoto, Kyoto (JP); Manabu Nakanishi, Kyoto (JP); Takashi Matsushita, Kyoto (JP)

(73) Assignee: SCREEN Semiconductor Solutions Co., Ltd., Kyoto (JP)

( * ) Notice: Subject to any disclaimer, the term of this patent is extended or adjusted under 35 U.S.C. 154(b) by 1023 days.

(21) Appl. No.: 13/667,281

(22) Filed: Nov. 2, 2012

(65) Prior Publication Data

US 2013/0140000 A1    Jun. 6, 2013

(30) Foreign Application Priority Data

Dec. 5, 2011    (JP) .............................. JP2011-265456

(51) Int. Cl.
   *F25B 29/00* (2006.01)
   *F27D 9/00* (2006.01)
   (Continued)

(52) U.S. Cl.
   CPC .... *H01L 21/67109* (2013.01); *F27B 17/0025* (2013.01)

(58) Field of Classification Search
   CPC ........... F27B 17/0025; H01L 21/67167; H01L 21/67109
   (Continued)

(56) References Cited

U.S. PATENT DOCUMENTS 5,512,320 A    4/1996 Turner et al.
5,607,009 A *  3/1997 Turner ................. C03C 17/002
                                                    118/725
(Continued)

FOREIGN PATENT DOCUMENTS

JP    6-151293    5/1994
JP    6-244124    9/1994
(Continued)

OTHER PUBLICATIONS

Office Action issued by Japanese Patent Office on Mar. 23, 2015 in connection with corresponding Japanese Application No. 2011-265456 with English Translation thereof.
(Continued)

*Primary Examiner* — Steven B McAllister
*Assistant Examiner* — Steven Anderson, II
(74) *Attorney, Agent, or Firm* — Ostrolenk Faber LLP

(57) ABSTRACT

Each of substrates which are sequentially loaded into an apparatus is transferred to one of empty (available) cooling units, and the cooling unit is reserved as a unit to be used for performing a cooling treatment after a post-exposure bake process for the substrate and the reservation information is stored. After one of the cooling units is reserved in advance before the post-exposure bake process, the substrate is transferred from the cooling unit to one of heating units without being subjected to a cooling treatment and is subjected to a post-exposure bake process therein. After the post-exposure bake process, the substrate is transferred from the heating unit to the reserved cooling unit which is reserved in advance and subjected to a cooling treatment therein.

4 Claims, 7 Drawing Sheets

(51) Int. Cl.
*H01L 21/67* (2006.01)
*F27B 17/00* (2006.01)

(58) Field of Classification Search
USPC .............................................................. 432/9
See application file for complete search history.

(56) References Cited

U.S. PATENT DOCUMENTS

| | | | |
|---|---|---|---|
| 2004/0020601 A1* | 2/2004 | Zhao | H01L 21/02126 156/345.32 |
| 2006/0165408 A1 | 7/2006 | Akmoto et al. | |
| 2006/0245855 A1* | 11/2006 | Hamada | H01L 21/6715 414/217 |
| 2009/0165711 A1 | 7/2009 | Ogura et al. | |
| 2010/0202867 A1 | 8/2010 | Hamada | |
| 2012/0093617 A1* | 4/2012 | Kudou | H01L 21/67748 414/222.01 |
| 2012/0213501 A1* | 8/2012 | Harumoto | F27B 17/0025 392/416 |
| 2014/0342558 A1 | 11/2014 | Ogura et al. | |

FOREIGN PATENT DOCUMENTS

| | | |
|---|---|---|
| JP | 10-335216 | 12/1998 |
| JP | 2000-353732 | 12/2000 |
| JP | 2004-319626 | 11/2004 |
| JP | 2005-5439 | 1/2005 |
| JP | 2006-203075 | 8/2006 |
| JP | 2006-310698 | 11/2006 |
| TW | 2009 35552 A | 8/2009 |

OTHER PUBLICATIONS

Office Action issued by Korean Patent Office on Oct. 15, 2013 in connection with corresponding Korean Patent Application No. 10-2012-0086203 with English Translation thereof.
Office Action issued by Taiwanese Patent Office on Dec. 23, 2014 in connection with corresponding Taiwanese Application No. 101127502 with Japanese and English Translations thereof.
Office Action issued by Japanese Patent Office on Nov. 24, 2015 in connection with corresponding Japanese Application No. 2011-265456 with English Translation thereof.

* cited by examiner

F I G. 3
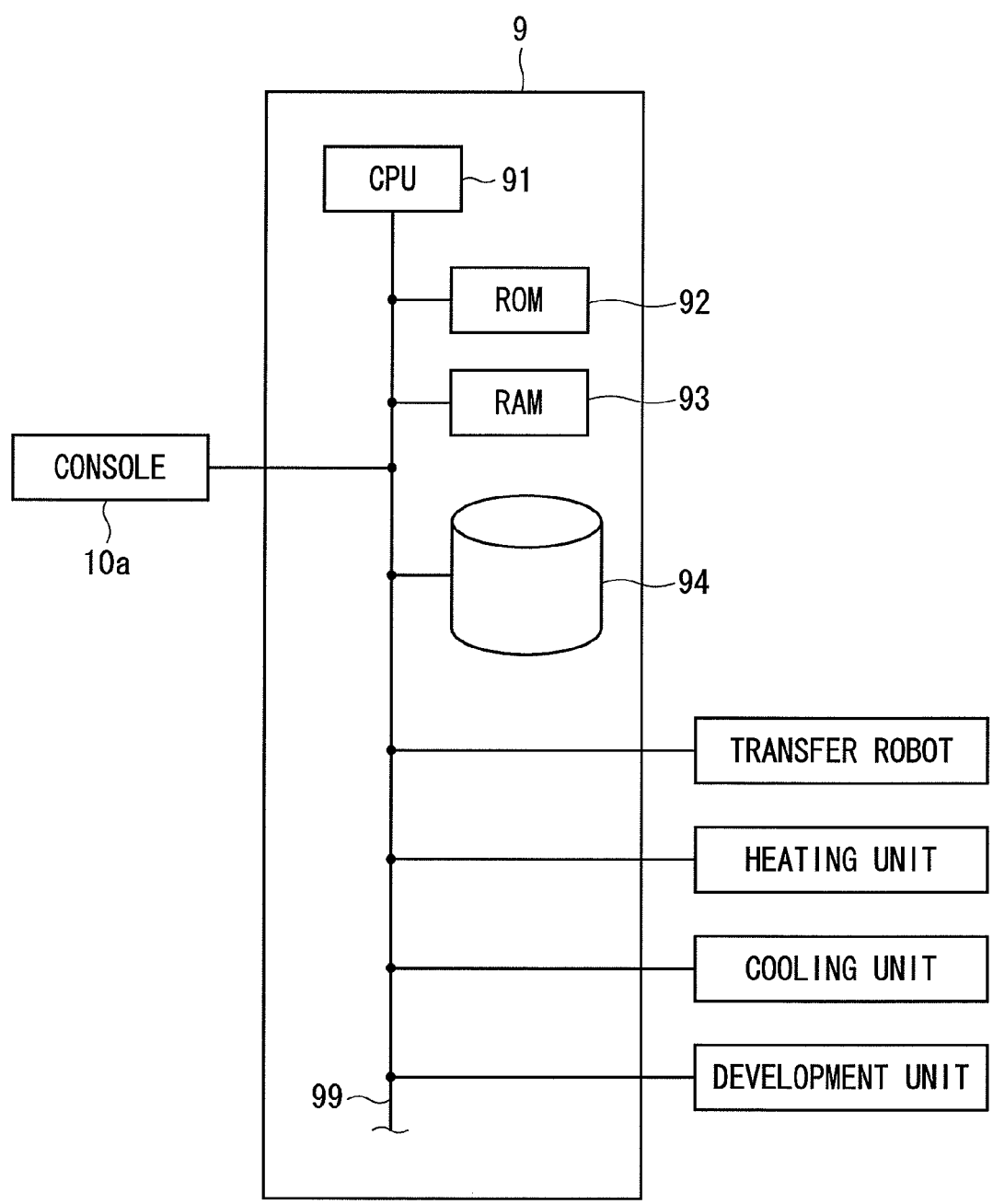

F I G. 6

| SUBSTRATE | RESERVED COOLING UNIT |
|---|---|
| W1 | CP1 |
| W2 | CP2 |
| W3 | CP3 |
| W4 | CP1 |
| ... | ... |

SUBSTRATE PROCESSING APPARATUS AND SUBSTRATE PROCESSING METHOD FOR PERFORMING HEAT TREATMENT ON SUBSTRATE

BACKGROUND OF THE INVENTION

Field of the Invention

The present invention relates to a substrate processing apparatus and a substrate processing method for performing a heat treatment for a predetermined time period and then performing a cooling treatment on thin plate-like precision electronic substrates such as semiconductor wafers, glass substrates for liquid crystal displays, and the like (hereinafter referred to simply as "substrates") which are sequentially loaded into the substrate processing apparatus.

Description of the Background Art

As well known, products of semiconductor devices, liquid crystal displays, and the like are manufactured by performing a series of processes including cleaning, resist coating, exposure, development, etching, interlayer insulating film formation, heat treatment, dicing, and the like on the aforementioned substrates. A substrate processing apparatus which incorporates a plurality of processing units for performing, for example, a resist coating process, a development process, and heat treatments accompanying these processes among the aforementioned processes and uses a transfer robot to circularly transfer a substrate between the processing units, to thereby perform a series of photolithography processes on the substrate is widely used as a so-called coater-and-developer.

Such a substrate processing apparatus transfers a substrate sequentially to a plurality of processing units and performs a predetermined processings thereon, in accordance with a predetermined processing flow. In performing the processings, when processing times for the processes are different, the process needing the longest processing time determines the overall rate and there occurs retention of substrates (waiting for unloading) in the processing units other than the one which performs the process needing the longest processing time. If the previous process of the process needing the longest processing time is a heat treatment, the substrate stays in a heating unit. When the substrate stays in the heating unit, the substrate is heated for over a specified processing time (overbaked) and this causes a problem of bringing significant hindrance to the processing result.

In recent photolithography processes, particularly, using a chemically amplified resist adaptable to a KrF excimer laser or an ArF excimer laser has become dominant. In a case where the chemically amplified resist is used, since the exposure intensity of the excimer laser is low, a post-exposure bake process is performed on a substrate after exposure and a chain reaction of a resist resin is caused to proceed with a product (acid) which is generated in a resist film by photochemical reaction during exposure as a catalyst. In such a post-exposure bake process, when overbaking occurs, the linewidth uniformity of patterns after development is significantly deteriorated.

In order to prevent such overbaking, it is thought to be effective to configure the processing units in the apparatus or define a processing flow so that a heating unit (e.g., post-exposure baking unit) which does not allow overbaking can take the longest processing time. With such a measure, since there are many empty (available) units, for example, for performing a cooling treatment which is a subsequent process of the post-exposure bake process, it is possible to prevent the retention of the substrate in the post-exposure baking unit.

Further, Japanese Patent Application Laid Open Gazette No. 2004-319626 and Japanese Patent Application Laid Open Gazette No. 6-151293 disclose techniques for preventing overbaking by providing a dedicated mechanism for immediately cooling the substrate after the heat treatment. By providing such a dedicated cooling mechanism, it is possible to reliably prevent overbaking regardless of respective processing times in various processes or a processing flow.

The measure to cause the heating unit which does not allow overbaking to take the longest processing time, however, suppresses an increase in the throughput of the whole apparatus. Further, if there arises a trouble in the downstream of the heating unit in a processing flow, it is impossible to prevent the retention of the substrate in the heating unit and it becomes hard to completely prevent overbaking.

On the other hand, if a dedicated cooling mechanism is provided in a one-to-one correspondence with the heating unit which does not allow overbaking, even when there arises a trouble in the downstream of the heating unit in a processing flow, it is possible to prevent overbaking since the substrate after the heat treatment can be cooled by using the dedicated cooling mechanism. Providing dedicated cooling mechanisms in such a manner, however, causes problems of increasing the size of the apparatus and increasing the manufacturing cost for the apparatus.

SUMMARY OF THE INVENTION

The present invention is intended for a substrate processing apparatus for performing a heat treatment for a predetermined time period on each of substrates which are sequentially loaded thereinto and then performing a cooling treatment thereon.

According to an aspect of the present invention, the substrate processing apparatus comprises at least one heat treatment part for performing a heat treatment on a substrate, a plurality of cooling treatment parts for performing a cooling treatment on a substrate, a substrate transfer part for transferring a substrate between the at least one heat treatment part and the plurality of cooling treatment parts, and a transfer control part configured to select in advance one of the plurality of cooling treatment parts which is to be used for performing a cooling treatment after a heat treatment for each of substrates which are sequentially loaded into the substrate processing apparatus and memorize the selected one cooling treatment part as a reserved cooling treatment part, and to control the substrate transfer part to transfer the substrate to one of the at least one heat treatment part so that the substrate is subjected to a heat treatment therein for a predetermined time period and then transfer the substrate from the heat treatment part to the reserved cooling treatment part so that the substrate is subjected to a cooling treatment therein.

By the present invention, since it is possible to immediately transfer the substrate after the heat treatment to the reserved cooling treatment part and start a cooling treatment thereon, overbaking can be reliably prevented without providing any dedicated cooling mechanism.

According to another aspect of the present invention, the substrate processing apparatus comprises at least one heat treatment part for performing a heat treatment on a substrate, a plurality of cooling treatment parts for performing a cooling treatment on a substrate, a substrate transfer part for transferring a substrate between the at least one heat treatment part and the plurality of cooling treatment parts, and a transfer control part configured to cause the substrate transfer part to transfer each of substrates which are sequentially loaded into the substrate processing apparatus to one of the plurality of cooling treatment parts and memorize the one cooling treatment part as a reserved cooling treatment part for the substrate, and to then control the substrate transfer part to transfer the substrate from the reserved cooling treatment part to one of the at least one heat treatment part so that the substrate is subjected to a heat treatment therein for a predetermined time period and then transfer the substrate from the heat treatment part to the reserved cooling treatment part so that the substrate is subjected to a cooling treatment therein.

The present invention is also intended for a substrate processing method for performing a heat treatment for a predetermined time period on each of substrates which are sequentially loaded into a substrate processing apparatus in one of at least one heat treatment part and then performing a cooling treatment thereon in one of a plurality of cooling treatment parts.

According to an aspect of the present invention, the substrate processing method comprises the steps of (a) selecting in advance one of the plurality of cooling treatment parts which is to be used for performing a cooling treatment after a heat treatment for each of substrates which are sequentially loaded into the substrate processing apparatus, to memorize the selected one cooling treatment part as a reserved cooling treatment part, (b) transferring the substrate to one of the at least one heat treatment part and performing a heat treatment thereon for a predetermined time period, and (c) transferring the substrate from the heat treatment part to the reserved cooling treatment part and performing a cooling treatment thereon.

By the present invention, since it is possible to immediately transfer the substrate after the heat treatment to the reserved cooling treatment part and start a cooling treatment thereon, overbaking can be reliably prevented without providing any dedicated cooling mechanism.

According to another aspect of the present invention, the substrate processing method comprises the steps of (a) transferring each of substrates which are sequentially loaded into the substrate processing apparatus to one of the plurality of cooling treatment parts and memorizing the one cooling treatment part as a reserved cooling treatment part for the substrate, (b) transferring the substrate from the reserved cooling treatment part to one of the at least one heat treatment part and performing a heat treatment thereon for a predetermined time period, and (c) transferring the substrate from the heat treatment part to the reserved cooling treatment part and performing a cooling treatment thereon.

Therefore, it is an object of the present invention to reliably prevent overbaking without providing any dedicated cooling mechanism.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a block diagram showing a constitution of a control part;

FIG. 6 is a view showing an example of reservation information stored in the control part.

DESCRIPTION OF THE PREFERRED EMBODIMENTS

Hereinafter, with reference to figures, discussion will be made on a preferred embodiment of the present invention.

Figure 1:
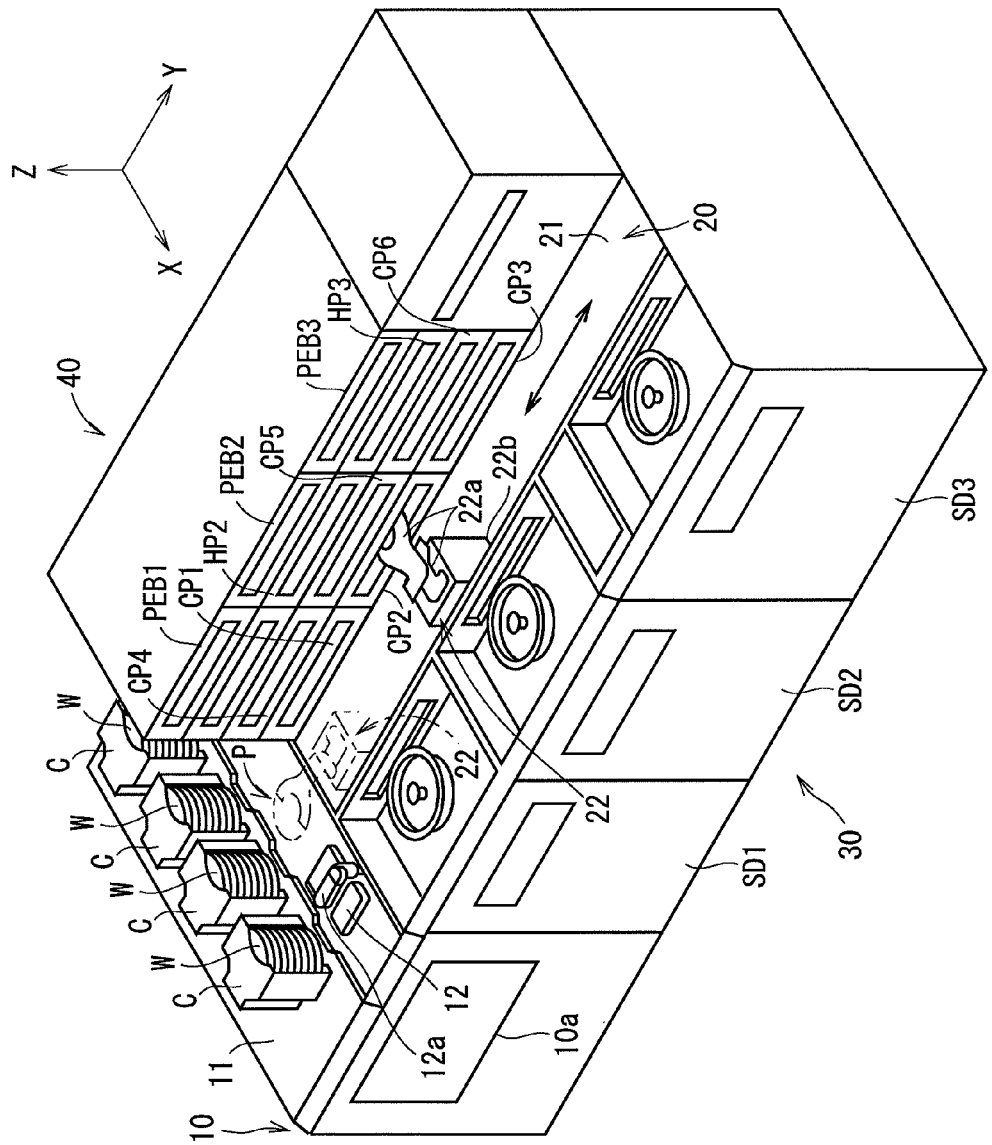
FIG. 1 is a perspective view showing a substrate processing apparatus in accordance with the present invention.
Figure 2:
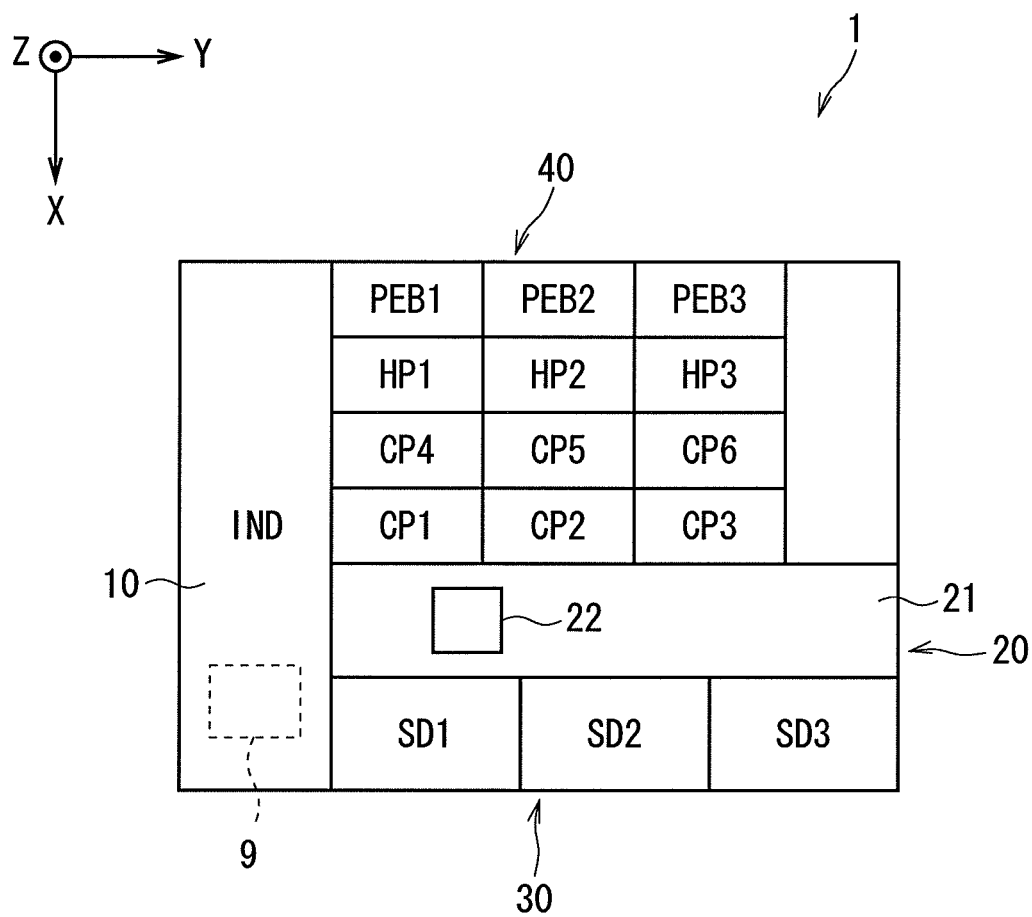
FIG. 2 is a view showing an arrangement of processing units in the substrate processing apparatus of FIG. 1.

First, discussion will be made on an overall structure of a substrate processing apparatus in accordance with the present invention. FIG. 1 is a perspective view showing a substrate processing apparatus 1 in accordance with the present invention. FIG. 2 is a view showing an arrangement of processing units in the substrate processing apparatus 1. In FIGS. 1 and 2, an XYZ rectangular coordinate system in which a Z-axis direction is defined as the vertical direction and an XY plane is defined as the horizontal plane is additionally shown for the purpose of clarifying the directional relationship among these processing units.

The substrate processing apparatus 1 is an apparatus for performing a development process on a substrate such as a semiconductor wafer or the like which has been subjected to an exposure process in an exposure device (stepper) which is separately provided. The substrate to be processed in the substrate processing apparatus 1 is coated with a film of chemically amplified resist, and after the resist film is subjected to pattern exposure using an excimer laser in the exposure device, the substrate W is loaded into the substrate processing apparatus 1. The substrate W to be processed in the substrate processing apparatus 1 of the present invention is not limited to a semiconductor wafer but may be a glass substrate for liquid crystal display, a glass substrate for photomask, or the like.

The substrate processing apparatus 1 comprises an indexer 10, a substrate transfer part 20, a first processing part group 30, and a second processing part group 40. The substrate transfer part 20 which has a long-length shape in a plan view is arranged with its longitudinal direction along a Y-axis direction. The first processing part group 30 is provided on a front side ((+X) side) of the apparatus and the second processing part group 40 is provided on a back side ((−X) side) of the apparatus so that the first processing part group 30 and the second processing part group 40 sandwich the substrate transfer part 20. The indexer 10 is connected to one end side ((−Y) side) of the substrate transfer part 20 along the longitudinal direction.

The indexer 10 has functions of loading an unprocessed substrate (exposed substrate) which is received from the outside of the apparatus into the apparatus and unloading a processed substrate which has been subjected to the development process to the outside of the apparatus. The indexer 10 comprises a rest table 11 for placing thereon a plurality of (in this preferred embodiment, four) carriers C in juxtaposition and an indexer robot 12 for taking an unprocessed substrate W out from each of the carriers C and for storing a processed substrate W into each of the carriers C. Each of the carriers C has a shelf structure in which a plurality of substrates W can be stored in multiple stages. The carrier C of the present preferred embodiment is an OC (Open Cassette) which exposes stored substrates W to the outside air. The carrier C is not limited to this type but may be a FOUP (Front Opening Unified Pod) or an SMIF (Standard Mechanical InterFace) pod, each of which stores substrates W in an enclosed or sealed space.

The indexer robot 12 is movable horizontally along a direction of arrangement of the four carriers C (the X-axis direction) and movable upwardly and downwardly (in the Z-axis direction), and also rotatable about an axis center along the vertical direction. The indexer robot 12 is equipped with a holding arm 12a for holding a substrate W in a horizontal position (with the normal of the substrate W being directed toward the vertical direction). The holding arm 12a is slidably movable back and forth. Therefore, the holding arm 12a moves horizontally along the X-axis direction, moves upwardly and downwardly, gyrates in a horizontal plane, and moves to and fro along the direction of the gyration radius. With these movements, the indexer robot 12 causes the holding arm 12a to individually access each of the carriers C, to thereby take out an unprocessed substrate W therefrom and store a processed substrate W therein, and causes the holding arm 12a to move to a substrate transfer position P where a substrate is passed to/from the substrate transfer part 20, to thereby pass a substrate W to/from a transfer robot 22.

In the substrate transfer part 20, the transfer robot 22 is arranged along a transfer path 21 extending along the Y-axis direction. The transfer robot 22 is provided with a movable base 22b which is movable horizontally along a longitudinal direction of the transfer path 21 (the Y-axis direction) and movable upwardly and downwardly (in the Z-axis direction), and also rotatable about an axis center along the vertical direction. The movable base 22b is equipped with two transfer arms 22a and 22a in vertically adjacent two stages, for holding a substrate W in a horizontal position. The transfer arms 22a and 22a are slidably movable back and forth independently of each other by a drive mechanism incorporated in the movable base 22b. Therefore, the transfer arms 22a and 22a each move horizontally along the Y-axis direction, move upwardly and downwardly, gyrate in a horizontal plane, and move to and fro along the direction of the gyration radius. The transfer robot 22 can thereby cause the two transfer arms 22a and 22a to individually access the processing units in the first processing part group 30, the processing units in the second processing part group 40, and the substrate transfer position P where a substrate is passed to/from the indexer 10, to thereby pass a substrate W thereto/therefrom. Then, the transfer robot 22 holds a substrate W which is taken out from one of the processing units in the first processing part group 30 or the second processing part group 40 and transfers the substrate W to one of the other processing units, to achieve circulation transfer of the substrate W among the processing units.

The first processing part group 30 consists of three development units SD1, SD2, and SD3 which are so arranged in parallel as to be adjoining to the transfer path 21 along the Y-axis direction. Each of the development units SD1, SD2, and SD3 comprises a spin chuck for rotating a substrate W in a horizontal plane while holding the substrate W in a horizontal position by adsorption, a nozzle for supplying a developer onto the substrate W held on the spin chuck, a spin motor for rotatably driving the spin chuck, a cup surrounding the substrate W held on the spin chuck, and the like. The three development units SD1, SD2, and SD3 serve as a concurrent processing part for performing the processing under the same conditions in the same process, and the number of concurrent processings is "3".

On the other hand, the second processing part group 40 consists of four stacked unit layers in each of which three heat treatment units arranged in parallel along the Y-axis direction. In other words, the second processing part group 40 comprises totally twelve heat treatment units. In FIG. 2, for convenience of illustration, the stacked layers in the Z-axis direction are shown, being stacked in the X-axis direction, in a plan view.

From the lower side, in the first-stage unit layer, provided are three cooling units CP1, CP2, and CP3 for cooling a heated substrate W to a predetermined temperature and keeping the substrate W at the predetermined temperature. In the second-stage unit layer, similarly, provided are three cooling units CP4, CP5, and CP6. These cooling units CP1 to CP6 are each provided with a cooling plate for cooling the substrate W while placing the substrate W in a case. The cooling units CP1 to CP3 cool a substrate W after the post-exposure bake process. The cooling units CP4 to CP6 cool a substrate W which has been heated after the development process.

From the lower side, in the third-stage unit layer, provided are three heating units HP1, HP2, and HP3 for heating a substrate W to a predetermined temperature. Then, in the uppermost-stage unit layer, provided are three heating units PEB1, PEB2, and PEB3 for heating a substrate W to a predetermined temperature to perform the post-exposure bake process. The three heating units HP1, HP2, and HP3 and the three heating units PEB1, PEB2, and PEB3 are each provided with a hot plate for heating the substrate W while placing the substrate W in a case. The three heating units HP1, HP2, and HP3 heat a substrate W after the development process. The three cooling units CP1, CP2, and CP3, the three cooling units CP4, CP5, and CP6, the three heating units PEB1, PEB2, and PEB3, and the three heating units HP1, HP2, and HP3 also serve as four concurrent processing parts, and the number of concurrent processings in each of the concurrent processing parts is "3".

Further, the substrate processing apparatus 1 is provided with a control part 9 for controlling various operation mechanisms and processing units described above. FIG. 3 is a block diagram showing a constitution of the control part 9. The control part 9 has a hardware constitution of general computer. Specifically, the control part 9 has a constitution in which a CPU 91 for performing various computations, a ROM 92 for storing a basic program, a RAM 93 which is a readable and writable memory for storing various information, and a magnetic disk 94 for storing a control program, data, and the like are connected to a bus line 99.

Further, to the bus line 99, the transfer robot 22, the heating units PEB1 to PEB3 and HP1 to HP3, the cooling units CP1 to CP6, the development units SD1 to SD3, and the like provided in the substrate processing apparatus 1 are electrically connected. The CPU 91 in the control part 9 executes the control program stored in the magnetic disk 94, to thereby control these operation mechanisms and the processing units to perform the heat treatment and the development process in the substrate processing apparatus 1.

Further, to the bus line 99, a console 10a is electrically connected. The console 10a is provided on a side wall surface of the indexer 10 (see FIG. 1) and provided with a touch panel or the like for displaying various information and receiving inputs of commands and parameters. Though FIG. 2 shows an arrangement in which the control part 9 is provided inside the indexer 10, the physical arrangement of the control part 9 is not limited to the inside of the indexer 10 but the control part 9 may be provided in any place inside the substrate processing apparatus 1.

Figure 4:
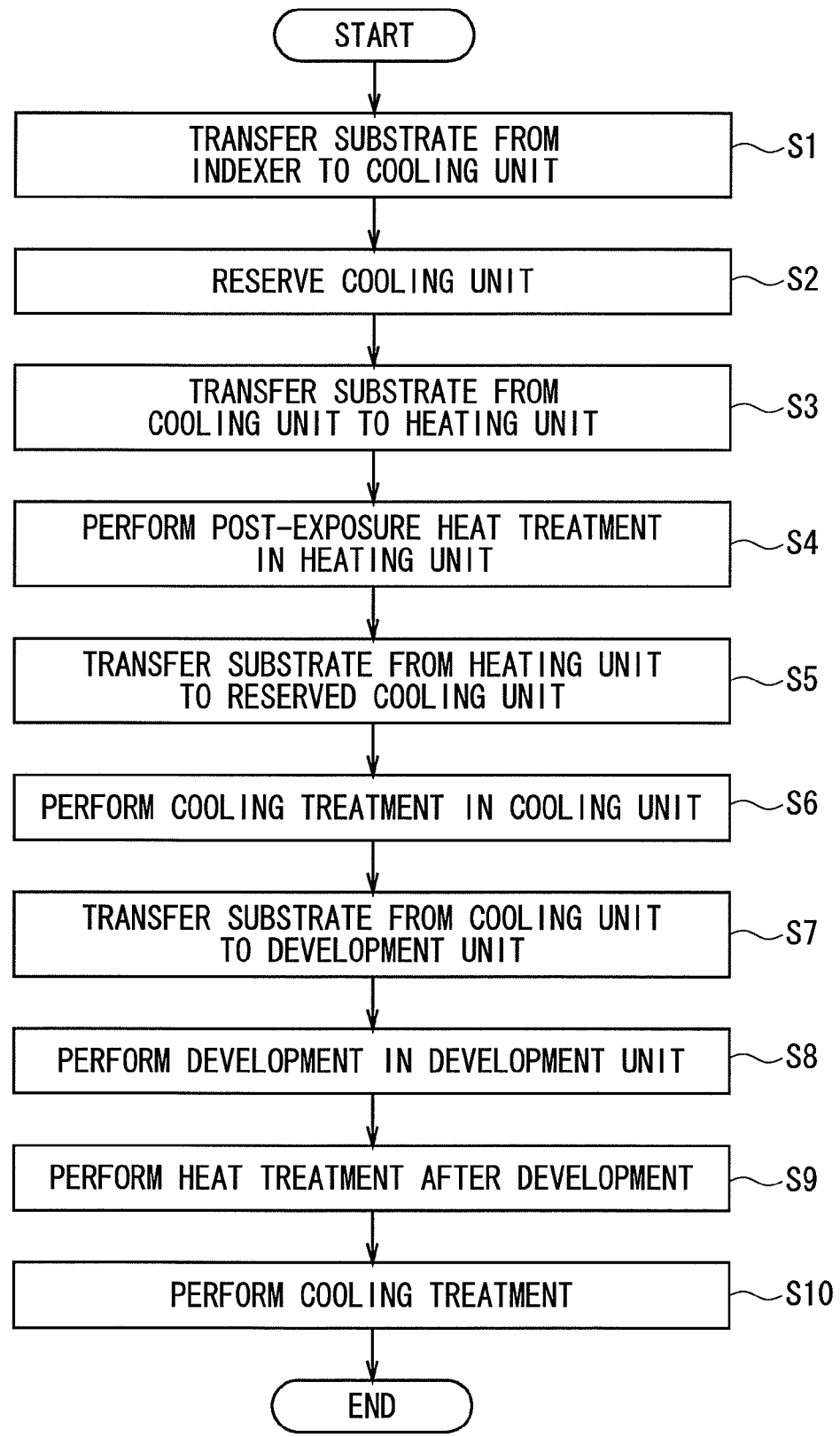
FIG. 4 is a flowchart showing a procedure of an operation of the substrate processing apparatus of FIG. 1.

Next, discussion will be made on an operation of the substrate processing apparatus 1 having the above-discussed constitution. FIG. 4 is a flowchart showing a procedure of an operation of the substrate processing apparatus 1. FIG. 4 shows an operation procedure on one substrate W included in a lot. The control part 9 controls the operation mechanisms and the processing units in the substrate processing apparatus 1 in accordance with a flow recipe describing a processing flow, to thereby make the operation procedure of FIG. 4 proceed. The processing flow described in the flow recipe of the present preferred embodiment describes that a substrate W which is loaded into the substrate processing apparatus 1 after the exposure process is subjected to the post-exposure bake process, cooled, subjected to the development process, heated, and then cooled.

Figure 5:
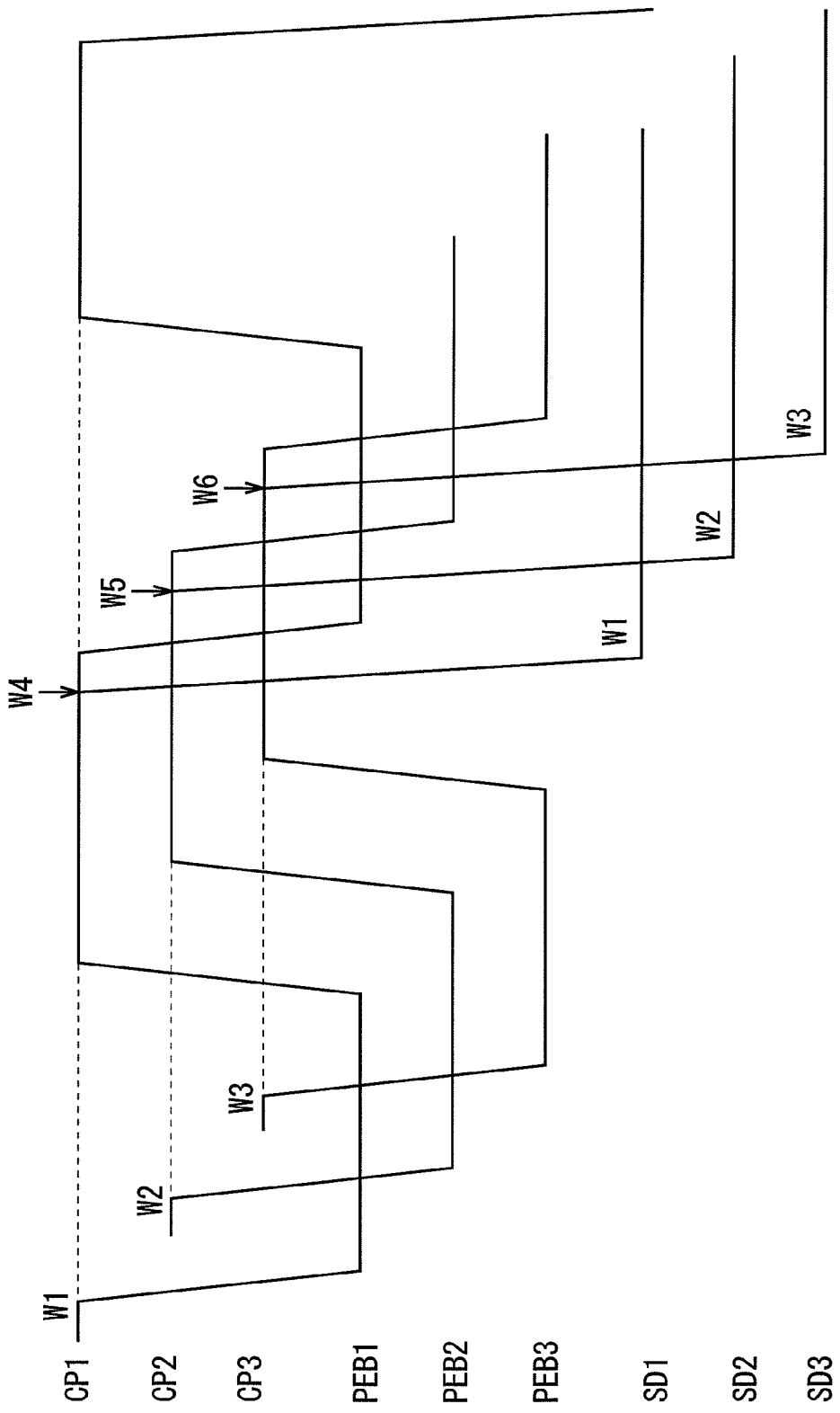
FIG. 5 is a timing chart showing transfer paths for substrates.

FIG. 5 is a timing chart showing transfer paths for substrates W. In FIG. 5 and the following discussion, the first substrate in a lot is represented by W1, the second substrate is represented by W2, the third substrate is represented by W3, and the following substrates are represented by signs in the same manner. When the order of loading does not matter, the substrate is generally referred to as the "substrate W".

First, a substrate W which has been subjected to the exposure process and is held in the carrier C is loaded into the indexer 10 from the outside of the substrate processing apparatus 1 by an AGV (Automated Guided Vehicle) or the like and placed on the rest table 11. Before the exposure process, a surface of the substrate W is coated with a film of chemically amplified resist and the resist film is subjected to pattern exposure using an excimer laser, and acid is generated in an exposed portion of the resist film by photochemical reaction.

Next, the substrate W is transferred from the indexer 10 to one of the cooling units CP1, CP2, and CP3 (Step S1). Specifically, the indexer robot 12 takes out the substrate W from the predetermined carrier C and passes the substrate W to the transfer robot 22 at the substrate transfer position P. Then, the transfer robot 22 transfers the received substrate W to one of the cooling units CP1, CP2, and CP3. Though the substrate W is transferred to a unit having an open port (empty flag is ON) among the cooling units CP1 to CP3, the substrate W is usually transferred to a unit having a smaller serial number. For example, the first substrate W1 in a lot is transferred to the cooling unit CP1, and the second substrate W2 in the lot is transferred to the cooling unit CP2.

Though the cooling units CP1 to CP3 are units originally for performing a cooling treatment on the substrate W, no cooling treatment is performed in Step S1. The substrate W is loaded into one of the cooling units CP1 to CP3 by the transfer robot 22 and passed to a lift pin which moves upwardly and downwardly with respect to the cooling plate, and then immediately unloaded by the transfer robot 22.

Further, at the point in time when the substrate W is loaded into one of the cooling units CP1 to CP3, the cooling unit is reserved as a unit to be used for performing a cooling treatment after the post-exposure bake process discussed later on the substrate W and memorized as a reserved cooling unit in a storage part (the RAM 93 or the magnetic disk 94) of the control part 9 (Step S2). For example, at the point in time when the first substrate W1 is loaded into the cooling unit CP1, the cooling unit CP1 is reserved as the reserved cooling unit after the post-exposure bake process for the substrate W1 and the reservation information is stored in the storage part of the control part 9. Similarly, at the point in time when the second substrate W2 is loaded into the cooling unit CP2, the cooling unit CP2 is reserved as the reserved cooling unit for the substrate W2 and the reservation information is stored in the storage part of the control part 9. Further, at the point in time when the third substrate W3 is loaded into the cooling unit CP3, the cooling unit CP3 is reserved as the reserved cooling unit for the substrate W3 and the reservation information is stored in the storage part of the control part 9.

FIG. 6 is a view showing an example of reservation information stored in the control part 9. One of the cooling units CP1, CP2, and CP3 is reserved for each of the substrates W which are sequentially loaded into the apparatus and associated with the substrate W. For example, the cooling unit CP1 is associated with the first substrate W1 and memorized (the reservation information on the cooling unit CP1 is stored), and the cooling unit CP2 is associated with the second substrate W2 and memorized.

Thus, the transfer of the substrate W to one of the cooling units CP1 to CP3 in Step S1 is performed in order to reserve the cooling unit to be used for performing the cooling treatment after the post-exposure bake process, not to perform a cooling treatment on the substrate W. At the point in time when a cooling unit is reserved, a port of the reserved cooling unit is changed to "being reserved" (reserved flag is ON). For example, at the point in time when the cooling unit CP1 is reserved as the reserved cooling unit for the substrate W1, a port of the cooling unit CP1 is changed to "being reserved". In FIG. 5, actual transfer paths for the substrates W are indicated by solid lines and reserved cooling units are indicated by dotted lines.

Next, the substrate W which is loaded into one of the cooling units CP1, CP2, and CP3 is transferred by the transfer robot 22 from the cooling unit to one of the heating units PEB1, PEB2, and PEB3 (Step S3). At that time, an empty unit having a smaller serial number is selected among the heating units PEB1, PEB2, and PEB3 and the substrate W is transferred to the selected heating unit. For example, in the present preferred embodiment, the first substrate W1 is transferred from the cooling unit CP1 to the heating unit PEB1, and the second substrate W2 is transferred from the cooling unit CP2 to the heating unit PEB2.

In each of the heating units PEB1 to PEB3, the post-exposure bake process is performed on the substrate W for a predetermined time period (Step S4). The post-exposure bake is a heat treatment for causing a chain reaction such as crosslinking or the like of a resist resin to proceed with a product generated in the film of chemically amplified resist by photochemical reaction during exposure as a catalyst, to thereby locally change the solubility to a developer only in an exposed portion. The chain reaction in the resist film proceeds when the temperature of the exposed resist film increases up to or beyond a predetermined temperature and stops when the temperature of the resist film decreases to below the predetermined temperature. Since the degree of progress of the chain reaction in the resist film has an effect on the pattern linewidth after the development process, in order to maintain the linewidth uniformity among the substrates which are sequentially loaded into the apparatus, it is required to quickly cool the substrate W after being subjected to the post-exposure bake process for a predetermined time period to below a reaction temperature. In other words, overbaking in the heating units PEB1 to PEB3 for performing the post-exposure bake process is not allowed to occur.

In the present preferred embodiment, after the post-exposure bake process for a predetermined time period is finished, the transfer robot 22 transfers the substrate W from the one of the heating units PEB1 to PEB3 to the cooling unit reserved in Step S2 (Step S5). At that time, the transfer robot 22 inevitably transfers the substrate W to the reserved cooling unit for the substrate W even if there are empty cooling units other than the reserved cooling unit at the point in time when the post-exposure bake process is finished. For example, though all the cooling units CP1 to CP3 are physically empty at the point in time when the post-exposure bake process on the first substrate W1 is finished in the heating unit PEB1, the substrate W1 is inevitably transferred to the cooling unit CP1 reserved in Step S2. Similarly, the substrates W2 and W3 after being subjected to the post-exposure bake process are inevitably transferred to the cooling units CP2 and CP3 reserved in Step S2, respectively. Specifically, the control part 9 refers to the reservation information (FIG. 6) stored in the storage part and controls the transfer robot 22 to transfer the substrate W after being subjected to the post-exposure bake process to the reserved cooling unit which is associated with the substrate W.

As shown in FIG. 5, at the point in time when the post-exposure bake process for the substrate W1 is finished, the cooling units CP2 and CP3 other than the cooling unit CP1 are empty but the ports thereof are being reserved. Transfer of not-associated substrate to a cooling unit with its port being reserved is disabled. For this reason, it is possible to reliably prevent the substrate W1 after being subjected to the post-exposure bake process from being transferred to the cooling units CP2 and CP3 which are reserved for the following substrates W2 and W3.

Conversely, since transfer of the substrates other than the substrate W1 to the cooling unit CP1 with its port being reserved is also disabled, it is possible to prevent the following substrates W2 and W3 and the substrate W4 transferred from the indexer 10 from being loaded into the cooling unit CP1 which is reserved for the substrate W1 while the substrate W1 is subjected to the post-exposure bake process in the heating unit PEB1. Therefore, at the point in time when the post-exposure bake process for the substrate W1 is finished, the cooling unit CP1 which is reserved for the substrate W1 cannot be occupied by or reserved for the other substrate W, and it is possible to immediately transfer the substrate W1 after being subjected to the post-exposure bake process to the reserved cooling unit.

The transfer of the substrate W to one of the cooling units CP1 to CP3 in Step S5 is performed in order to perform the cooling treatment on the substrate W after being subjected to the post-exposure bake process. In other words, the substrate W which is transferred to one of the cooling units CP1 to CP3 in Step S5 is subjected to the cooling treatment in the cooling unit (Step S6). At the point in time when the substrate W is transferred to one of the cooling units CP1 to CP3 in Step S5 and the cooling treatment starts in Step S6, the port of the cooling unit is changed to "being used" (use flag is ON). For example, at the point in time when the substrate W1 after being subjected to the post-exposure bake process is transferred to the cooling unit CP1 and the cooling treatment starts, the port of the cooling unit CP1 is changed to "being used". By the cooling treatment, the temperature of the resist film decreases to below a predetermined temperature and the chain reaction in the resist film stops. Further, the temperature of the substrates W in the cooling units CP1 to CP3 is controlled to a constant temperature before the development process.

After the cooling treatment for a predetermined time period is finished, the transfer robot 22 transfers the substrate W from the one of the cooling units CP1 to CP3 to one of the development units SD1 to SD3 (Step S7). At that time, one of the development units SD1 to SD3 which is empty can be selected and the substrate W is transferred to the selected development unit. For example, in the present preferred embodiment, the first substrate W1 is transferred from the cooling unit CP1 to the development unit SD1, and the second substrate W2 is transferred from the cooling unit CP2 to the development unit SD2. At the point in time when the cooling treatment in one of the cooling units CP1 to CP3 is finished, the port of the cooling unit becomes open (empty flag becomes ON). For example, at the point in time when the cooling treatment for the substrate W1 in the cooling unit CP1 is finished, the port of the cooling unit CP1 becomes open. By opening the port of the cooling unit CP1, it becomes possible to transfer the following substrate W4 to the cooling unit CP1 and reserve the cooling unit CP1 as a unit to be used for performing the cooling treatment after the post-exposure bake process for the substrate W4 (see FIG. 5). Further, when the substrate W1 is taken out from the cooling unit CP1 in Step S7, the two transfer arms 22a and 22a are used to interchange the substrate W1 and the substrate W4. The three downward arrows in FIG. 5 indicate the timings of interchanges between the substrates W1 and W4, between the substrates W2 and W5, and between the substrates W3 and W6, respectively.

In any one of the development units SD1 to SD3, a developer is supplied onto the substrate W to cause the development process to proceed (Step S8). In the development process, only the exposed portion or the unexposed portion in the resist film by pattern exposure is dissolved by the developer. Then, after the development process is finished, the transfer robot 22 transfers the substrate W from the one of the development units SD1 to SD3 to one of the heating units HP1 to HP3 which is empty. In the heating units HP1 to HP3, performed is a heat treatment (hard bake) to completely dry a small amount of water left in the resist film after the development process (Step S9). Then, after the heat treatment for a predetermined time period is finished, the transfer robot 22 transfers the substrate W from the one of the heating unit HP1 to HP3 to one of the cooling units CP4 to CP6 which is empty. In the cooling units CP4 to CP6, the cooling treatment for the substrate W which has been heated in Step S9 is performed (Step S10). For convenience of illustration, FIG. 5 shows the process steps until the development process in Step S8 and omits the heat treatment process in Step S9 and the following processes.

After the cooling treatment for a predetermined time period is finished, the transfer robot 22 unloads the substrate W from the one of the cooling units CP4 to CP6 and passes the substrate W to the indexer robot 12 at the substrate transfer position P. Then, the indexer robot 12 stores the received substrate W into a predetermined carrier C as a processed substrate. After that, the carrier C in which a predetermined number of processed substrates W are stored is unloaded to the outside of the apparatus, and this completes a series of processes in the substrate processing apparatus 1.

In the present preferred embodiment, each of substrates W which are sequentially loaded into the apparatus is transferred to the one of cooling units CP1 to CP3 which is empty (a port thereof is open) and the cooling unit is reserved as a unit to be used for performing the cooling treatment after the post-exposure bake process for the substrate W and the reservation information is stored in the storage part of the control part 9. Then, after reserving one of the cooling units CP1 to CP3 in advance before the post-exposure bake process, the substrate W is transferred from the cooling unit to one of the heating units PEB1 to PEB3 and subjected to the post-exposure bake process therein. After the post-exposure bake process is finished, the substrate W is transferred from the heating unit to the reserved cooling unit which is reserved in advance and subjected to the cooling treatment therein.

Since the reserved cooling unit which is reserved in advance is physically empty but the port thereof is being reserved, transfer of and reservation for substrates other than the substrate W for which the reserved cooling unit is reserved are disabled. Therefore, at the point in time when the post-exposure bake process is finished, the reserved cooling unit is reliably empty, and it is possible to immediately transfer the substrate W after being subjected to the post-exposure bake process to the reserved cooling unit and start the cooling treatment thereon. It is thereby possible to reliably prevent overbaking of the substrate W after the post-exposure bake process.

Further, in the present preferred embodiment, the cooling units CP1 to CP3 to be reserved in advance are units for performing the cooling treatment after the post-exposure bake process also in a normal processing flow. In other words, in the present preferred embodiment, the cooling units CP1 to CP3 for performing a normal cooling treatment after the post-exposure bake process are reserved in advance before the post-exposure bake process, and these cooling units CP1 to CP3 are not dedicated cooling mechanisms which are additionally provided. Therefore, in accordance with the present preferred embodiment, it is possible to reliably prevent overbaking without increasing the size of the substrate processing apparatus 1 due to a dedicated cooling mechanism which is additionally provided.

Since the substrate W after the post-exposure bake process is cooled by the cooling plate provided in each of the cooling units CP1 to CP3, it is possible to control the temperature of the substrate W to a constant temperature before the development process with high accuracy.

In order to reliably reserve in advance a cooling unit to be used after the post-exposure bake process as discussed above, the number of cooling units to be reserved should not be smaller than the number of heating units for performing the post-exposure bake process. Though the three cooling units CP1, CP2, and CP3 are provided as many as the three heating units PEB1, PEB2, and PEB3 for performing the post-exposure bake process in the present preferred embodiment, four or more cooling units may be provided.

Since the transfer robot 22 performs the transfers of the substrates W among all the processing units included in the first processing part group 30 and the second processing part group 40, a plurality of transfer requests may be made at the same timing. In such a case, the control part 9 controls the transfer robot 22 to transfer the substrate from one of the heating units PEB1 to PEB3 to the reserved cooling unit in Step S5 as the top priority. For this reason, it is possible to quickly transfer the substrate W after being subjected to the post-exposure bake process to the reserved cooling unit and start the cooling treatment, and it is therefore possible to reliably prevent overbaking of the substrate W after the post-exposure bake process. Further, the time period from the time when the post-exposure bake process is finished to the time when the cooling treatment starts can be made constant and it is therefore possible to suppress a variation in the linewidth uniformity among a plurality of substrates W which are sequentially loaded into the apparatus. The second priority next to the transfer of the substrate in Step S5 is given to the transfer of the substrate from one of the cooling units CP1 to CP3 to one of the heating units PEB1 to PEB3 in Step S3.

The cycle time of the substrate processing in the substrate processing apparatus 1 is the longest one among the respective cycle times of the processes included in the processing flow (the processing time of the processing unit for performing the process/the number of concurrent processings in the processing units) and ((the processing time of the heating units PEB1 to PEB3)+(the processing time of the cooling units CP1 to CP3)/the number of concurrent processings in the cooling units CP1 to CP3). The cycle time is an apparent processing time per substrate, and in other words, a value of the real processing time in consideration of the number of concurrent processings. In the case of the present preferred embodiment, for example, though it takes about 120 seconds to perform the development process in the development units SD1 to SD3, since the development units SD1 to SD3 serve as a concurrent processing part for performing the processing under the same conditions in the same process and the number of concurrent processings is "3", the cycle time of the development process is 120/3=40 seconds. Specifically, though it takes 120 seconds to perform the development process on one substrate W by one development unit, since the three development units SD1 to SD3 are provided in the apparatus as a whole, an apparent development process time per substrate W is 40 seconds (in other words, the development process on one substrate W is performed for an average of 40 seconds). The value obtained by dividing the unit time (e.g., one hour=3600 seconds) by the cycle time is a throughput indicating the number of substrates W which the apparatus can processes per unit time.

The reason why ((the processing time of the heating units PEB1 to PEB3)+(the processing time of the cooling units CP1 to CP3)/the number of concurrent processings in the cooling units CP1 to CP3) is taken into consideration as the cycle time of the substrate processing apparatus 1 is that the time period while the cooling units CP1 to CP3 are being reserved should be considered as the time period while the cooling units CP1 to CP3 are being used, as well as the actual processing time. In the case of the present preferred embodiment, for example, the processing time for the post-exposure bake process in the heating units PEB1 to PEB3 is about 60 seconds and the processing time for the cooling treatment in the cooling units CP1 to CP3 is also about 60 seconds. Therefore, the above value is (60+60)/3=40 seconds.

In order to increase the throughput of the substrate processing apparatus 1, it is necessary to reduce the cycle time. In order to reduce the cycle time, it is necessary to increase the number of concurrent processings in each process. In the prior art, since the heating units for performing the post-exposure bake process which does not allow overbaking should take the longest cycle time, it is impossible to easily increase the number of concurrent processings in the process. In the present invention, however, since the substrate W after being subjected to the post-exposure bake process can be immediately transferred to the cooling unit which is reserved in advance and the cooling treatment thereon can quickly start, it is also possible to easily increase the number of concurrent processings in the heating units PEB1 to PEB3. As discussed above, however, since the number of cooling units to be reserved should not be smaller than the number of heating units for performing the post-exposure bake process, it is necessary to also increase the number of concurrent processings in the cooling units for performing the cooling treatment after the post-exposure bake process when the number of concurrent processings in the heating units for performing the post-exposure bake process increases. By increasing the number of concurrent processings in the heating units for performing the post-exposure bake process and in the cooling units for performing the cooling treatment after the post-exposure bake process, it is possible to reduce the cycle time of the substrate processing apparatus 1 and increase the throughput thereof.

Further, in order to make the standby time (time period while no processing is performed) of each processing unit as short as possible and increase the operation efficiency, it is necessary to make the cycle times of the processes as uniform as possible. In the present preferred embodiment, since ((the processing time of the heating units PEB1 to PEB3)+(the processing time of the cooling units CP1 to CP3)/the number of concurrent processings in the cooling units CP1 to CP3) and the cycle time of the development process are each 40 seconds, there arises few useless standby time in these processing units.

Though the preferred embodiment of the present invention has been discussed above, the present invention is not limited to the above-discussed preferred embodiment, but allows various variations without departing from the scope and spirit of the present invention. For example, though the substrate W before being subjected to the post-exposure bake process is actually transferred to one of the cooling units CP1 to CP3 and the cooling unit is reserved in advance as a unit to be used for performing the cooling treatment for the substrate W after the post-exposure bake process in the above-discussed preferred embodiment, one of the cooling units CP1 to CP3 may be reserved in advance without actually transferring the substrate W thereto. Specifically, since the substrate W is actually transferred to one of the cooling units CP1 to CP3 in Step S1 in order to reserve the cooling unit in advance, not to perform a cooling treatment, it is not always necessary to actually transfer the substrate W thereto. For this reason, one of the cooling units CP1 to CP3 may be only selected and reserved in advance as a unit to be used for performing the cooling treatment for the substrate W after the post-exposure bake process without actually transferring the substrate W thereto.

Specifically, the control part 9 may select one of the cooling units CP1 to CP3 which has an open port, to virtually transfer the substrate W to the selected cooling unit, and reserve the cooling unit as a unit to be used for performing the cooling treatment for the substrate W after the post-exposure bake process. Like in the preferred embodiment, the reservation information including the reserved cooling unit is stored in the storage part of the control part 9. After that, as an actual transfer, the substrate W is transferred from the indexer 10 to one of the heating units PEB1, PEB2, and PEB3 and subjected to the post-exposure bake process. After the post-exposure bake process is finished, the substrate W is transferred from the one of the heating units PEB1 to PEB3 to the cooling unit which is reserved in advance. The following processes are performed in the same manner as in the preferred embodiment. Also by this method, it is possible to produce the same effect as that in the above-discussed preferred embodiment.

In summary, one of the cooling units CP1 to CP3 should be selected in advance as a cooling unit to be used for performing the cooling treatment after the post-exposure bake process for each of substrates which are sequentially loaded into the apparatus and memorized as a reserved cooling unit regardless of whether the substrate W is actually transferred to the cooling unit or not. Then, after the substrate W is transferred to one of the heating units PEB1 to PEB3 and subjected to the post-exposure bake process for a predetermined time period therein, the substrate W is transferred from the heating unit to the above-described reserved cooling unit and subjected to the cooling treatment therein. Also by this method, since the substrate W after being subjected to the post-exposure bake process can be immediately transferred to the reserved cooling unit and the cooling treatment thereon can quickly start, it is possible to reliably prevent overbaking of the substrate W after the post-exposure bake process.

Further, application of the present invention is not limited to the heating units PEB1 to PEB3 for performing the post-exposure bake process and the cooling units CP1 to CP3 for performing the cooling treatment after the post-exposure bake process, but the present invention may be applied to other heat treatments in which overbaking becomes a problem. For example, the present invention may be applied to the heating units HP1 to HP3 for performing the heat treatment after the development process and the cooling units CP4 to CP6 for performing the cooling treatment after that, where the cooling units CP4 to CP6 are reserved in advance in the same manner as in the preferred embodiment. By this method, it is possible to reliably prevent overbaking of the substrate W after a hard bake process.

Furthermore, the constitution of the substrate processing apparatus 1 in the above-discussed preferred embodiment is only one example and the substrate processing apparatus 1 may have different constitution. There may be a case, for example, where the substrate processing apparatus 1 is connected to an exposure device (stepper) through an interface and the substrates W after being subjected to the exposure process are sequentially loaded into the apparatus directly from the interface. The number of heating units for performing the post-exposure bake process which are equipped in the substrate processing apparatus 1 is not limited to three but may be at least one. Though the number of cooling units CP1 to CP3 which are equipped in the substrate processing apparatus 1, for performing the cooling treatment after the post-exposure bake process, is not limited to three, since the number of the cooling units should not be smaller than the number of the heating units for performing the post-exposure bake process, it is preferable that the number of cooling units should be two or more.

Figure 7:
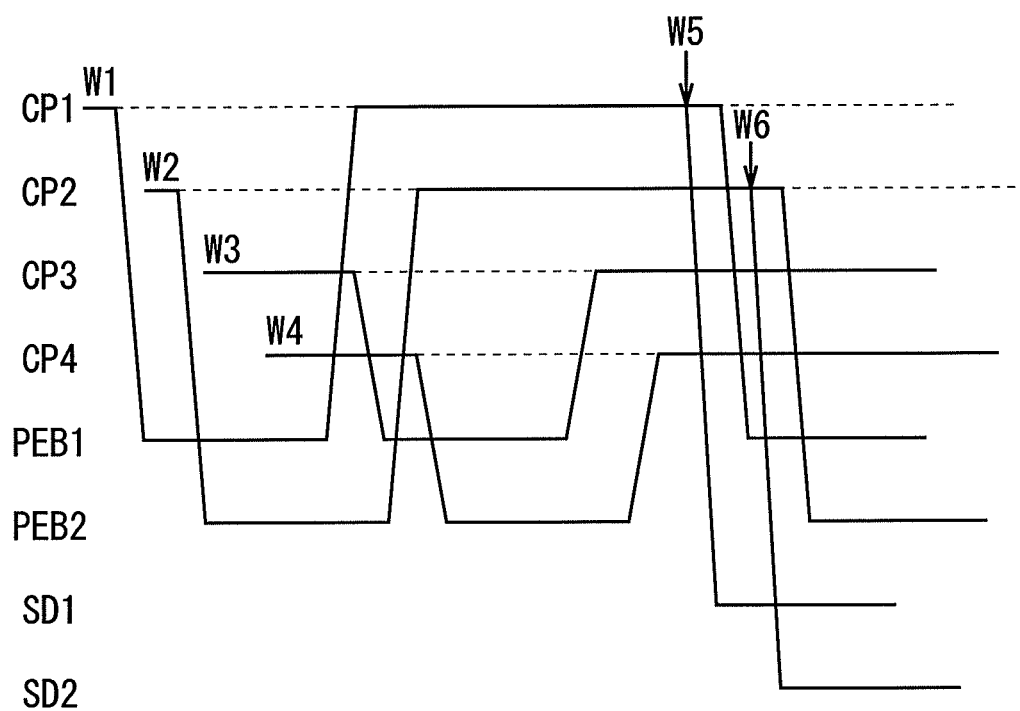
FIG. 7 is a timing chart showing transfer paths for substrates.

FIG. 7 is a timing chart showing transfer paths for substrates in a case where four cooling units (CP1 to CP4), two heating units (PEB1 and PEB2), and two development units (SD1 and SD2) are provided. In accordance with the flowchart of FIG. 4, the processes of Steps S1 to S10 are performed on the substrates W. Like in the timing chart of FIG. 5, each of the substrates W is transferred from the indexer 10 to one of the cooling units CP1 to CP4 which is empty and not reserved, and the cooling unit is reserved. Then, after the substrate W is transferred to one of the heating units PEB1 and PEB2 and subjected to the post-exposure bake process therein, the substrate W is transferred to the reserved cooling unit which is reserved in advance and subjected to the cooling treatment therein. The two downward arrows in FIG. 7 indicate the timings of interchanges between the substrates W.

Further, the substrate processing apparatus 1 may be equipped with a coating unit for performing resist coating, a heating unit for performing a heat treatment after the coating process, and a cooling unit for performing a cooling treatment after the heat treatment. In the apparatus having such a constitution, the present invention may be applied to a post-applied bake (PAB) process in which a heat treatment is performed on the substrate W on which a resist film is formed by the resist coating, to thereby evaporate the solvent ingredients in the resist.

Furthermore, the substrate W to be processed by the substrate processing technique of the present invention is not limited to a semiconductor wafer but may be a glass substrate used for liquid crystal display or a substrate for solar cell.

While the invention has been shown and described in detail, the foregoing description is in all aspects illustrative and not restrictive. It is therefore understood that numerous modifications and variations can be devised without departing from the scope of the invention.

What is claimed is:

1. A substrate processing apparatus for performing a heat treatment for a predetermined time period on each of substrates which are sequentially loaded thereinto and then performing a cooling treatment thereon, comprising:
   at least one heat treatment chamber for performing a heat treatment on a substrate;
   a plurality of cooling treatment chambers for performing a cooling treatment on a substrate, the number of said plurality of cooling treatment chambers being not less than the number of said heat treatment chambers;
   a substrate transfer part for transferring a substrate between said at least one heat treatment chamber and said plurality of cooling treatment chambers;
   a transfer control part configured to select prior to the performance of said heat treatment on said substrate, one of said plurality of cooling treatment chambers which is reserved to be used for performing a cooling treatment after a heat treatment for each of substrates that are sequentially loaded into said substrate processing apparatus and memorize said selected one cooling treatment chamber as a reserved cooling treatment chamber, and to control said substrate transfer part to transfer said substrate to one of said at least one heat treatment chamber so that said substrate is subjected to a heat treatment therein for a predetermined time period and then transfer said substrate from said heat treatment chamber to said reserved cooling treatment chamber so that said substrate is subjected to a cooling treatment therein; and
   said transfer control part is configured to disable loading of a subsequent substrate into said reserved cooling treatment chamber during a period while said heat treatment chamber performs a heat treatment on said substrate.

2. The substrate processing apparatus according to claim 1, wherein
   said heat treatment chamber performs a post-exposure heat treatment on a substrate which has been subjected to an exposure process after being coated with a chemically amplified resist.

3. A substrate processing apparatus for performing a heat treatment for a predetermined time period on each of substrates which are sequentially loaded thereinto and then performing a cooling treatment thereon, comprising:
   at least one heat treatment chamber for performing a heat treatment on a substrate;
   a plurality of cooling treatment chambers for performing a cooling treatment on a substrate, the number of said plurality of cooling treatment chambers being not less than the number of said heat treatment chambers;
   a substrate transfer part for transferring a substrate between said at least one heat treatment chamber and said plurality of cooling treatment chambers;
   a transfer control part configured to cause said substrate transfer part to transfer each of substrates which are sequentially loaded into said substrate processing apparatus to one of said plurality of cooling treatment chambers and memorize said one cooling treatment chamber as a reserved cooling treatment chamber for said substrate, and to then control said substrate transfer part to transfer said substrate from said reserved cooling treatment chamber to one of said at least one heat treatment chamber so that said substrate is subjected to a heat treatment therein for a predetermined time period and then transfer said substrate from said heat treatment chamber to said reserved cooling treatment chamber so that said substrate is subjected to a cooling treatment therein; and
   said transfer control part is configured to disable loading of a subsequent substrate into said reserved cooling treatment chamber during a period while said heat treatment chamber performs a heat treatment on said substrate.

4. The substrate processing apparatus according to claim 3, wherein
   said heat treatment chamber performs a post-exposure heat treatment on a substrate which has been subjected to an exposure process after being coated with a chemically amplified resist.

* * * * *